United States Patent [19]
Krishna

[11] 3,988,772
[45] Oct. 26, 1976

[54] CURRENT ISOLATION MEANS FOR INTEGRATED POWER DEVICES

[75] Inventor: Surinder Krishna, Ballston Lake, N.Y.

[73] Assignee: General Electric Company, Schenectady, N.Y.

[22] Filed: May 28, 1974

[21] Appl. No.: 474,034

[52] U.S. Cl. .................................. 357/64; 357/60; 357/37; 357/46; 357/88; 357/89; 357/90
[51] Int. Cl.² ............... H01L 29/167; H01L 29/00; H01L 27/02; H01L 29/04
[58] Field of Search ............. 357/60, 64, 37, 46, 357/88, 89, 90

[56] References Cited
UNITED STATES PATENTS

| | | |
|---|---|---|
| 2,813,048 | 11/1957 | Pfann .................................. 357/60 |
| 3,461,359 | 8/1969 | Raithel et al. ..................... 357/64 |
| 3,513,367 | 5/1970 | Wolley ................................ 357/64 |
| 3,727,116 | 4/1973 | Thomas et al. .................... 357/64 |
| 3,775,196 | 11/1973 | Wakamiya et al. ................. 357/64 |

*Primary Examiner*—Edward J. Wojciechowicz
*Attorney, Agent, or Firm*—Donald M. Winegar; Joseph T. Cohen; Jerome C. Squillaro

[57] ABSTRACT

The minority carrier lifetime is drastically reduced in an integrated semiconductor power device by introducing deep level impurities such, for example, as gold, silver, platinum, nickel and copper into selected regions of the device by Thermal Gradient Zone Melting processing.

44 Claims, 5 Drawing Figures

CURRENT ISOLATION MEANS FOR INTEGRATED POWER DEVICES

BACKGROUND OF THE INVENTION

1. Field of the Invention

This invention relates to semiconductor integrated power devices and means for controlling the minority carrier lifetime therein and for providing regions of current isolation between mutually adjacent devices.

2. Description of the Prior Art

Often two or more semiconductor power devices are manufactured on a common substrate to provide an integrated power device. Such an integrated power device may comprise a triac, which is two semiconductor controlled rectifiers in an antiparallel circuit arrangement, a reverse conducting semiconductor controlled rectifier, which is a semiconductor controlled rectifier and a rectifier in an antiparallel circuit arrangement, and transistor — semiconductor controlled rectifier combinations. The manufacture and utilization of such device combinations on a common substrate necessitates satisfactory current isolation between adjacent power devices. Current isolation between devices is required to prevent injected carriers from a device which is in an "on" state from diffusing into neighboring devices and affecting the performance thereof.

Heretofore, current isolation has been achieved by the diffusing of gold metal into desired regions of a substrate. However, this process which is practiced has a serious disadvantage in that while gold is diffusing into the substrate to form the current isolation region, the gold is also diffusing into the active regions of the mutually adjacent devices as well. The end result of this extraneous gold diffusion is an adverse affect on the conductive losses and high temperature $dv/dt$ of the power devices. A greater physical separation can be provided between mutually adjacent power devices but at the expense of the active volume of the substrate available for device fabrication.

An object of this invention is to provide a new and improved current isolation means between two mutually adjacent semiconductor devices in an integrated circuit which overcome the deficiencies of the prior art.

Another object of this invention is to provide current isolation means between mutually adjacent semiconductor devices in an integrated semiconductor device while requiring the employment of a minimum volume of semiconductor material.

A further object of this invention is to provide a means for controlling the minority carrier lifetime of one or more devices and simultaneously provide a current isolation region between the at least one device and a mutually adjacent semiconductor device.

Other objects of this invention will, in part, be obvious and will, in part, appear hereinafter.

In accordance with the teachings of this invention, there is provided a body of semiconductor material having two major opposed surfaces forming specifically the top and bottom surfaces of the body. The body also has a peripheral side surface and a first level of minority carrier lifetime. At least one region of recrystallized semiconductor material is disposed within the body substantially perpendicular to and extending between, and terminating in the two opposed major surfaces. The recrystallized semiconductor material has a metal disposed throughout the region to impart a second level minority carrier lifetime thereto. The at least one region has a substantially constant level of minority carrier lifetime throughout the region and divides the body into at least two mutually adjacent regions each of which is in abutting contact with the at least one region of recrystallized semiconductor material. A minority carrier lifetime junction is formed by the abutting surfaces of each pair of regions of different levels of minority carrier lifetime. A semiconductor device is formed in each of the at least two regions of the divided body. Suitable solid solubility materials include gold, platinum, silver, nickel and copper. Additionally, an array of recrystallized regions may provide a selected volume of at least one of the devices in order to control the minority carrier lifetime therein.

DESCRIPTION OF THE INVENTION

Figure 1:
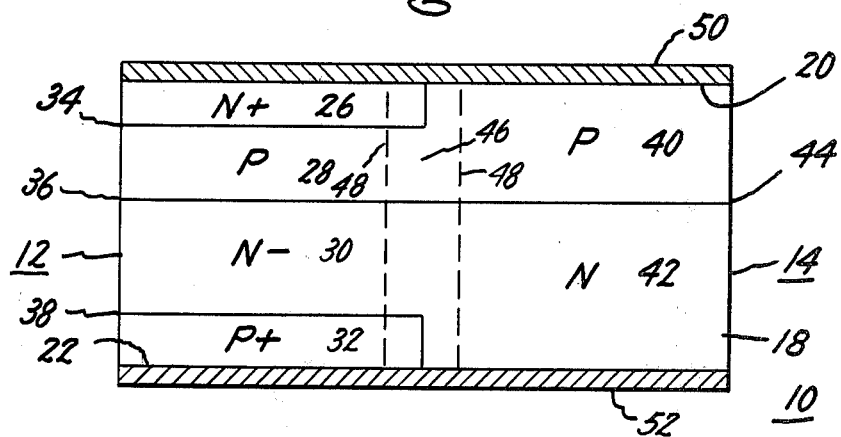
FIGS. 1 through 5 are elevation views in cross-section of various semiconductor devices made in accordance with the teachings of this invention.

With reference to FIG. 1, there is shown a reverse conducting semiconductor control rectifier (SCR) 10 which includes a semiconductor switch 12 and a rectifier 14. The SCR 10 may be an individual device or it may be a portion of a larger integrated circuit. In either case, the device 10 comprises a body 18 of a single crystal semiconductor material having a selected resistivity and a first type conductivity. The body 18 has opposed major surfaces 20 and 22 which are the top and bottom surfaces respectively thereof. The semiconductor material comprising the body 18 may be silicon, germanium, silicon carbide, gallium arsenide, a semiconductor compound of a Group II element and a Group VI element and a semiconductor compound of a Group IV element and a Group V element. In order to describe the invention more fully, and for no other purpose, the body is said to be of silicon semiconductor material.

Employing standard semiconductor processing techniques well known to those skilled in the art such, for example, as diffusion, epitaxial growth, combinations of diffusion and epitaxial growth and the like, the various discrete regions of the SCR 10 are formed in one portion of the body 18. Such manufacturing techniques produce four region semiconductor switch 12 and the rectifier 14. The switch 12 has four regions 26, 28, 30 and 32 of alternate and opposite type conductivity. The arrangement may be an $N^+$ P $N^-$ $P^+$ as shown or $P^+NPN$, and the like. PN junctions 34, 36 and 38 are formed by the abutting faces of the respective pairs of regions 26 and 28, 28 and 30, and 30 and 32 of opposite type conductivity and each have portions substantially parallel to the top and bottom surfaces 20 and 22.

A diode or rectifier 14 is formed in an adjacent discrete region of the body 18 and comprises two regions 40 and 42 of opposite type conductivity. The regions 40 and 42 may be of P and N type conductivity respectively as shown or N and P type conductivity respectively. In all instances, the rectifier 14 is forward biased in a direction which is opposite to the forward biasing of the switch 12. PN junction 14 is formed by the abutting surfaces of the regions 40 and 42 of opposite type conductivity. A portion of the PN junction 44 is substantially parallel to the top and bottom surfaces 20 and 22 of the body 18.

During operation of the SCR 10, the normal injection of carriers and diffusion thereof may inadvertently cause some of the carriers to stray into the adjacent component and detrimentally affect the component's operating characteristics. Prior art processing techniques embodied a single or double diffusion process to introduce a deep level impurity metal into the body 18 to control the minority carrier lifetime thereof and to provide current isolation between neighboring devices. However, diffusion of the deep level impurity metal, particularly gold, is not selected and a graded structure results laterally between neighboring components as well as perpendicular to the two major opposed surfaces. Therefore, for optimum component operation for the device 10, a current isolation region 46 is introduced into a selected volume of the body 18. The region 46 is preferably formed in the body 18 by a Temperature Gradient Zone Melting Process and has a specified level of minority carrier lifetime which is different from the level of minority carrier lifetime present in the device 10 as processed so far. The region 46 prevents carriers from either of the devices 12 or 14 from affecting the electrical characteristics of the other when the device 10 is operational. The abutting surfaces of the region 46 and each of the devices 12 and 14 form a minority carrier lifetime junction 48 which divides the two volumes of different levels of minority carrier lifetime. As formed, the junction 48 may be abrupt or of a graded configuration. An abrupt junction is preferred.

The region 46 is preferably formed by a Thermal Gradient Zone Melting Process as described in the copending patent application of Anthony and Cline entitled "Process for Making Isolation Grids", Ser. No. 411,022, now U.S. Pat. No. 3,904,442 and assigned to the same assignee as the subject matter of this invention and incorporated herein by reference. Briefly, in Temperature Gradient Zone Melting, the processed body 18 of silicon is mechanically polished, chemically etched to remove any damaged surfaces, rinsed in deionized water and dried in air. An acid resistant mask is disposed on the surface 20 of the body 18. Preferably, the mask is of silicon oxide which is either thermally grown or vapor deposited on the surface 20 by any of the methods well known to those skilled in the art. Employing well known photolithographical techniques, a photoresist, such, for example, as Kodak Metal Etch Resist, is disposed on the surface of the silicon oxide layer. The resist is dried by baking at a temperature of about 80° C. A suitable mask of spaced lines of a predetermined width and spaced a predetermined distance apart, as required, is disposed on the layer of photoresist and exposed to ultraviolet light. After exposure, the layer of photoresist is washed in xylene to open windows in the mask where the lines are desired so as to be able to selectively etch the silicon oxide layer exposed in the windows.

Selective etching of the layer of silicon oxide is accomplished with a buffered hydrofluoric acid solution ($NH_4F$-HF). The etching is continued until a second set of windows corresponding to the windows of the photoresist mask are opened in the layer of silicon oxide to expose selective portions of the surface 20 of the processed body 18 of silicon. The processed body 18 is rinsed in deionized water and dried. The remainder of the photoresist mask is removed by immersion in concentrated sulphuric acid at 180° C or by immersion in a mixture of 1 part by volume hydrogen peroxide and 1 part by volume concentrated sulphuric acid.

Selective etching of the exposed surface areas of the processed body 18 is accomplished with a mixed acid solution. The mixed acid solution is 10 parts by volume nitric acid, 70%, 4 parts by volume acetic acid, 100%, and 1 part by volume hydrofluoric acid, 48%. At a temperature of from 20° to 30° C, the mixed acid solution selectively etches the silicon of the processed body 18 of at rate of approximately 5 microns per minute. A trough is etched in the surface 20 of the processed body 12 beneath each window of the oxide layer. The selective etching is continued until the depth of trough is approximately equal to the width of the window in the silicon oxide layer. However, it has been discovered, that the trough should not be greater than approximately 100 microns in depth because undercutting of the silicon oxide layer will occur. Undercutting of the layer of silicon oxide has a detrimental effect on the width of the metal "wire" to be migrated through the body. The etched processed body 18 is rinsed in distilled water and blown dry. Preferably, a gas such, for example, as freon, argon, and the like, is suitable for drying the processed body 18.

The processed body 18 is disposed in a metal evaporation chamber. A metal layer is deposited on the remaining portions of the layer of silicon oxide and on the exposed silicon in the troughs. The metal in the troughs are the metal wires to be migrated through the body 12. The metal of the wires comprises a material, either substantially pure in itself or a mixture or alloy of the metal for controlling the minority carrier lifetime, and an intrinsic material, and possibly another material for imparting a selected level of resistivity to the recrystallized material of the processed body 18 through which it migrates. Gold, silver, nickel, copper and platinum are suitable materials for controlling the minority carrier lifetime of the recrystallized region 46. Tin and lead are suitable materials which, when employed with any of the aforementioned gold, silver, copper, nickel and platinum, will control the level of minority carrier lifetime in the region 46.

The thickness of the layer of material of the metal wires to be migrated is approximately equal to the depth of the trough. Therefore, if the trough is approximately 20 microns deep, the metal layer or each metal wire is approximately 20 microns in thickness. Prior to migrating the metal wires in the troughs through the processed body 18, the excess metal of the metal wires is removed from the silicon oxide layer by such suitable means as grinding away the excess metal with 600 grit carbide paper or by selective chemical etching.

It has been discovered that the vapor deposition of the metal wires should be performed at a pressure of approximately $5 \times 10^{-5}$ torr. It has been found that in some instances, metal deposited in the troughs on the silicon surface, upon subsequent melting, does not penetrate into the silicon and migrate through the processed body 18. It is believed that the layer of metal is saturated with oxygen which prevents reduction of a thin layer of silicon oxide, formed when the silicon surface is exposed to air, by the deposited metal and thus, a good wetting of the contiguous surfaces of silicon. The initial melting and alloying of the deposited metal with silicon required for migration is not obtained because of the inability of deposited metal atoms to diffuse into the silicon interface. In a like manner, materials deposited by sputtering are not as desirable because a sputtered material appears to be saturated with oxygen. The preferred methods of depositing the materials of the metal wires on the processed silicon body 18 are by the electron beam method and the like wherein little, if any, oxygen can be trapped in the deposited metal wires.

The processed body 18 is placed in a migration apparatus, not shown, and the metal wires in the troughs are migrated through the processed body 18 by a Thermal Gradient Zone Melting Process. A thermal gradient of approximately 50° C per centimeter between the top surface 20, which is the hot face, and the surface 22, which is the cold face, has been discovered to be appropriate for an average temperature of the processed body 18 from 700° C to 1350° C. The process is practiced for a sufficient length of time to migrate all the metal wires through the processed body 18. For example, for metal wires of 20 microns thickness, a thermal gradient of the order of 50° C/cm, a temperature of the body 10 of approximately 1100° C, and a pressure of $5 \times 10^{-5}$ torr, a furnace time of less than 12 hours is required to migrate the wires through a silicon body 18 of 1 centimeter thickness.

The Temperature Gradient Zone Melting Process and apparatus therefore is not a part of this invention. For a more thorough understanding of the apparatus employed in the process, one is directed to the copending applications of Anthony and cline entitled "Method of Making Deep Diode Devices," Ser. No. 411,150, now U.S. Pat. No. 3,901,736; "Deep Diode Device Production and Method," Ser. No. 411,021, now abandoned in favor of Set. No. 552,154; "Deep Diode Devices and Method and Apparatus," Ser. No. 411,001; "High Velocity Thermomigration Method of Making Deep Diodes," Ser. No. 411,015, now U.S. Pat. No. 3,898,106; "Deep Diode Device Having Dislocation-Free P-N Junctions and Method," Ser. No. 411,009, now U.S. Pat. No. 3,899,361; and "The Stabilized Droplet Method of Making Deep Diodes Having Uniform Electrical Properties," Ser. No. 411,008, and assigned to the same assignee of this invention.

Upon completion of the temperature gradient zone melting process, the metal wires which have migrated through the processed body 18 onto the surface 22 are removed by selective etching or grinding. The resulting processed body 18 is further processed by affixing ohmic electrical contacts 50 and 52 to the respective surfaces 20 and 22 as shown in FIG. 1. The region 46 has a selective level of minority carrier lifetime which is of as different level than that of the processed body 18. The region 46 comprises material which is recrystallized material of the body 18 suitably doped with a material comprising the metal wire and having an impurity concentration sufficient to obtain the desired level of minority carrier lifetime. The metal retained in the recrystallized region is the maximum allowed by the crystalline structure of the material through which it has migrated and the temperature of processing the body 18. It is semiconductor material with a maximum solid solubility of the impurity metal therein for the process temperature employed. It is not semiconductor material which has eutectic material therein, and it is not an alloy of the impurity and the semiconductor materials. The region 46 has substantially a constant uniform level of minority carrier lifetime throughout the entire region both perpendicular, to the surfaces 20 and 22 and parallel to the surfaces 20 and 22. The region 46 is substantially the same width throughout the processed body 18 and the junctions 48 as produced are abrupt and substantially free of metal inclusions.

The migration of the metal wires need not be practiced only in a negative atmosphere. Thermal gradient zone melting can be successively practiced in a position inert gas atmosphere whether it is a wafer of the order of 10 mils or a piece of semiconductor material 1 centimeter or more in thickness. Suitable inert gases for the next atmosphere are hydrogen, helium, argon and the like.

Although the metal wires appear to be stable during thermal gradient zone melting processing when processing wafers of approximately no greater than 18 mils thickness, it is preferred that the planar orientation of the opposed major surfaces, the axis of wire migration and the stable metal wire directions be as shown in the Table.

Table I

| Wafer Plane | Migration Direction | Stable Wire Directions | Stable Wire Sizes |
|---|---|---|---|
| (100) | <100> | <011>* | <100 microns |
|  |  | <0$\bar{1}$1>* | <100 microns |
| (110) | <110> | <1$\bar{1}$0>* | <150 microns |
| (111) | <111> | a) <01$\bar{1}$> |  |
|  |  | <10$\bar{1}$> | <500 microns |
|  |  | <1$\bar{1}$0> |  |
|  |  | b) <11$\bar{2}$>* |  |
|  |  | <$\bar{2}$11>* | <500 microns |
|  |  | <1$\bar{2}$1>* |  |
| + |  | c) Any other direction in (111) plane | <500 microns |

*The stability of the migrating wire is sensitive to the alignment of the thermal gradient with the <100>, <110> and <111> axis, respectively.
+Group a is more stable than group b which is more stable than group c.

The device 10 as fabricated provides an excellent current isolation means in the region 46 to prevent carrier generated within one component from affecting the electrical characteristics of a mutally adjacent components. Additionally, the region for providing the current isolation, that is, the region having a selected level of minority carrier lifetime different from that level of the remainder of the body, is confined to a particular volume of the body. The distribution of the metal impurity which controls the level of minority carrier lifetime is substantially constant throughout the region in any plane which is either parallel or perpendicular to the two major opposed surfaces.

Figure 2:
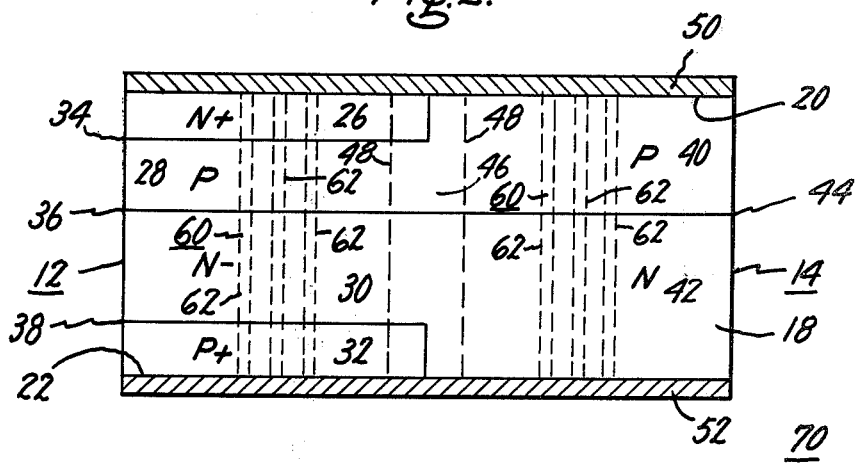

Referring now to FIG. 2, the minority carrier lifetime is controlled in selected regions of the components 12 and 14 of the device 10 by introducing an array 60 of columnar regions 62 in selected portions of each of the components preferably by the thermal gradient zone melting techniques. When completed, each component has superior turn-off and temperature characteristics than that of prior art devices. The plurality of columnar regions is an excellent means for controlling the minority carrier lifetime of the device. The temperature gradient zone melting process practiced herein enables one to distribute the columnar regions throughout the hottest region of the device and therefore the region of maximum current density and the maximum free carrier density of the device. Therefore, the device of this invention has a superior turn-off time and improved surface leakage capability when compared to prior art devices. The device of this invention has improved voltage and temperature ratings in comparison to prior art devices. The introduction of a minority carrier lifetime controlling material by the process of this invention does not cause substantially any of the material to precipitate at the boundaries of the diffused regions such, for example, as phosphorous diffused regions and to deplete other regions such, for example, as boron diffused regions.

The design of the columnar array of regions is such as to provide the array of regions at a distance less than a diffusion length apart from each other.

I define a diffusion length as follows:

Diffusion length is the average distance to which minority carries diffuse between generation and recombination. It is also that distance which a minority carrier is likely to travel before recombination occurs when the carrier concentration is low. When high carrier injection levels are encountered, the diffusion length for the ambipolar, or two carriers which are present, is that distance which the two carriers are likely to travel before recombination occurs. The free carriers between the columnar regions are able to move into the heavy recombination centers of the recrystallized regions very rapidly. In essence, therefore, the array of columnar regions functions as a uniformly doped region.

The columnar arrangement of the recrystallized regions of deep level impurities and the process for producing the same is very adaptable for controlling the minority carrier lifetime in semiconductor devices wherein mutually adjacent P-N junctions, and particularly those defining the base width of the device, are spaced preferably on the order of 40 or more microns apart. This spacing is preferred since the alloy droplet migrating through the body dissolves the material of the body at the forward end and deposits it at the same end of the droplet. Consequently, when migration across a P-N junction occurs, the portion of the P-N junction traversed by the droplet is displaced a distance in the same direction as the migration is occuring up to the length of the droplet. Preferably, the droplet is of the order of 10 microns or less in length and the P-N junction may be displaced up to approximately 10 microns or less. This displacement of the P-N junction is tolerable in large area power devices wherein power ratings are given with a tolerance of ± 10% of the normal power rating.

The array of columnar regions is preferably formed by migrating metal droplets, comprising the same impurity metals employed to form the region 46, through the selected regions of the components 12 and 14. The metal of the droplets is deposited in selected areas of the surface 20 in the same manner as the metal wires only in a metal dot configuration. It has been discovered that when the body 10 is of silicon, germanium, silicon carbide, gallium arsenide semiconductor material and the like, the migrating metal droplet has a preferred shape which also give rise to each resulting recrystallized region 46 being of the same cross-sectional shape as the migrating droplet. In a crystal axis direction of <111> of thermal migration the droplet migrates as a triangular platelet laying in a <111> plane. The platelet is bounded on its edges by (11$\bar{2}$) planes. A droplet larger than 0.10 centimeter on an edge is unstable and breaks up into several droplets during migration. A droplet smaller than 0.0010 centimeter may not migrate into the body 10 because of a surface barrier problem.

The ratio of the droplet migration rate over the imposed thermal gradient is a function of the temperature at which the migration of the droplet is practiced. At high temperatures of the order of 1050° to 1400° C, droplet migration velocity increases rapidly with increasing temperature. A velocity of 10 centimeters per day or $1.2 \times 10^{-4}$ centimeter per second is obtainable for such metal droplets which comprise aluminum and silicon.

The droplet migration rate is also affected by the droplet volume. The droplet migration rate decreases with a decrease in the droplet volume.

A droplet migrates in the <100> crystal axis direction as a pyramid bounded by four forward 111 planes and a rear 100 plane. Careful control of the thermal gradient and migration rate is a necessity. Otherwise, the region 36 may be deposited with twists and kinks therein. It appears that there is a non-uniform dissolution of the four forward 111 facets in that they do not always dissolve at the uniform rate. Non-uniform dissolution of the four forward 111 facets may cause the regular pyramidal shape of the droplet to become distorted into a trapazoidal shape.

The arrays and the regions 46 are preferably formed simultaneously to minimize the likelihood of the minority carrier lifetime control metal from diffusing into undesirable volumes of the body 18.

Figure 3:
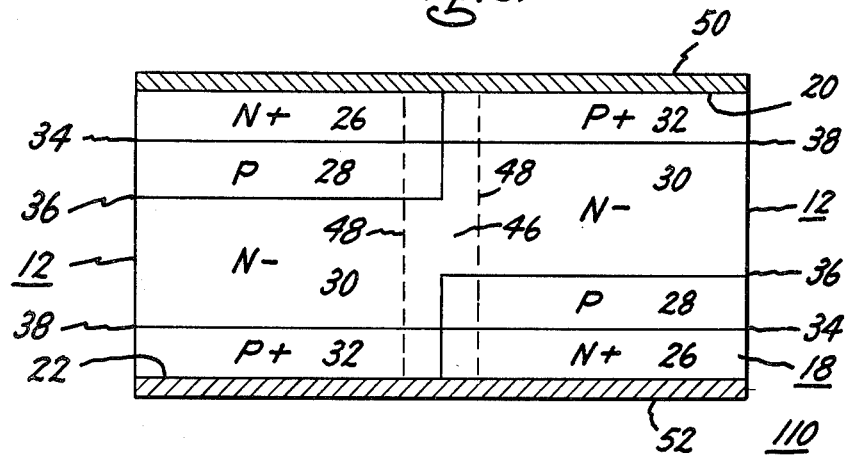

With reference to FIG. 3, the device of 110 is modified to provide a device 110 having two semiconductor switches 12 arranged in antiparallel. Again, the region 46 of a select level of minority carrier lifetime provides a means of correct isolation between the two components 12. All items of FIG. 2, denoted by the same reference numerals as employed in FIG. 1, are the same, and function in the manner, as the item in FIG. 1.

Figure 4:
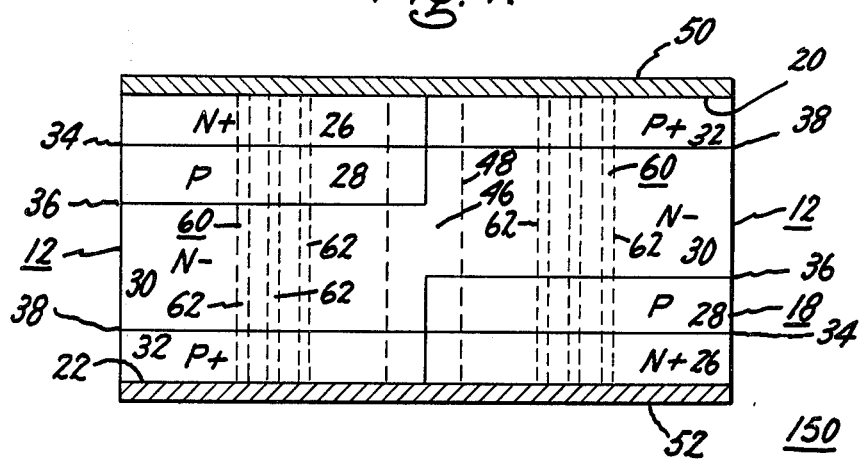

Referring now to FIG. 4, the device 110 is further modified, in the same manner as previously described relative to the device 20 of FIG. 2. The items of FIG. 4 denoted by the same reference numerals in FIG. 3, are the same as, and function in the same manner as, the items previously described relative to FIG. 3.

Figure 5:
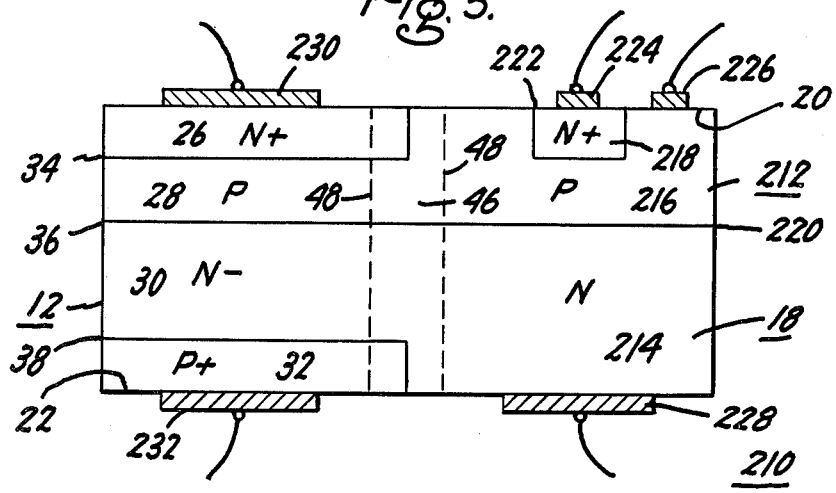

Another embodiment of this invention is shown in FIG. 5 wherein the device 210 comprises the body 18 of semiconductor material processed to form the semiconductor switch in one region separated from a transistor 212 formed in an adjoining region of the body 18 by the region 46 of the select level of minority carrier lifetime.

The transistor 212 comprises a collector region 214, base region 216 and an emitter region 218. P-N junctions 220 and 222 are formed by the abutting surfaces of each pair of regions 214 and 216 and 216 and 218 of opposite type conductivity. Ohmic electrical contacts 224, 226 and 228 are affixed to respective regions 218, 216 and 214 of the transistor 212 to provide for a functional device.

Ohmic electrical contacts 230 and 232 are affixed to the respective regions 26 and 28 to provide a suitable means for electrically contacting the semiconductor control rectifier 12.

As before, the region 46 functions in the same manner as previously described to prevent carriers generated in each of the devices 12 and 18 from affecting the electrical characteristics of the other device.

I claim as my invention:

1. An integrated semiconductor power device comprising:
    a body of semiconductor material having two major opposed surfaces which are, respectively, the top and bottom surfaces thereof, a predetermined type conductivity, a vertical axis which is aligned substantially parallel with a first preferred axis of the material of the body, and a first predetermined carrier lifetime;

at least one of the two major opposed surfaces having a preferred planar crystal orientation which is one selected from the group consisting of (100), (110) and (111);

at least two mutually adjacent semiconductor devices formed in the body and in abutting contact with one another;

each device including at least two regions of alternate and opposite type conductivity;

a P-N junction formed by the contiguous surfaces of the material of each abutting pair of regions of opposite type conductivity in each device;

a portion of at least one P-N junction in each of the devices is aligned parallel with the two opposed major surfaces of the body;

a first region of recrystallized semiconductor material disposed in the body, extending entirely through the body, and terminating in, the two opposed major surfaces of the body, the first region having a vertical axis which is aligned substantially parallel with the first preferred axis of the material of the body and the vertical axis of the body, and a second predetermined carrier lifetime, and the first region includes a predetermined portion of the material of each of the mutually adjacent devices in abutting contact with each other;

the first region being oriented in the body along a preferred wire direction which is aligned substantially parallel with a second preferred axis of the material of the body;

a first array of columnar regions of recrystallized semiconductor material disposed in the body and so arranged as to extend entirely through a predetermined portion of one of the devices of the body from one opposed major surface to the other, each columnar region having a longitudinal axis aligned substantially parallel with each of the other longitudinal axes and with the first preferred crystal axis of the body and a third predetermined carrier lifetime;

a second array of columnar regions of recrystallized semiconductor material disposed in the body and so arranged as to extend entirely through a predetermined portion of the other one of the devices of the body from one opposed major surface to the other, each columnar region having a longitudinal axis aligned substantially parallel with each of the other longitudinal axes and with the first preferred crystal axis of the body and a fourth predetermined carrier lifetime, and each first region and columnar region of recrystallized semiconductor material is formed in situ in the body by the migration of a respective melt of metal-rich semiconductor material of the region of the body through which it is migrated by a thermal gradient zone melting process at a predetermined elevated temperature along a thermal gradient established substantially parallel with the first crystal axis of the material of the body and has a predetermined level of concentration of the metal of the melt, as determined by the solid solubility limit of that metal in that semiconductor material at that predetermined elevated temperature of migration, the metal being distributed substantially uniformly throughout the entire region and including at least one deep level impurity material suitable for imparting the predetermined carrier lifetime thereto.

2. The semiconductor device of claim 1 wherein the first region of second carrier lifetime has a substantially uniform width throughout the region.

3. The semiconductor device of claim 1 wherein each junctions between two different carrier lifetimes is a step abrupt.

4. The semiconductor device of claim 1 wherein the impurity material is one selected from the group consisting of gold, platinum, silver, nickel and copper.

5. The semiconductor device of claim 1 wherein the material of the body is one selected from the group consisting of silicon, silicon carbide, germanium and gallium arsenide.

6. The semiconductor device of claim 5 wherein the impurity material is one selected from the group consisting of gold, platinum, silver, nickel and copper.

7. The semiconductor device of claim 6 wherein the semiconductor material of the body is silicon, and the impurity material is gold.

8. The semiconductor device of claim 1 wherein the preferred planar crystal orientation is (100), the first preferred crystal axis is $<100>$, and the second preferred crystal axis is one selected from the group consisting of $<011>$ and $<0\bar{1}1>$.

9. The semiconductor device of claim 8 wherein the semiconductor material of the body is one selected from the group consisting of silicon, germanium, silicon carbide and gallium arsenide.

10. The semiconductor device of claim 9 wherein the impurity material is one selected from the group consisting of gold, platinum, silver, nickel and copper.

11. The semiconductor device of claim 10 wherein the semiconductor material of the body is silicon, and the impurity material is gold.

12. The semiconductor device of claim 1 wherein the preferred planar crystal orientation is (110), the first preferred crystal axis is $<110>$, and the second preferred crystal axis is $<1\bar{1}0>$.

13. The semiconductor device of claim 12 wherein the material of the body is one selected from the group consisting of silicon, silicon carbide, germanium and gallium arsenide.

14. The semiconductor device of claim 13 wherein the impurity material is one selected from the group consisting of gold, platinum, silver, nickel and copper.

15. The semiconductor device of claim 14 wherein the semiconductor material of the body is silicon, and the impurity material is gold.

16. The semiconductor device of claim 1 wherein the preferred planar crystal orientation is (111), the first preferred crystal axis is $<111>$, and the second preferred crystal axis is one selected from the group consisting of $<01\bar{1}>$, $<10\bar{1}>$, $<1\bar{1}0>$, $<11\bar{2}>$, $<\bar{2}11>$ and $<1\bar{2}1>$.

17. The semiconductor device of claim 16 wherein the material of the body is one selected from the group consisting of silicon, silicon carbide, germanium and gallium arsenide.

18. The semiconductor device of claim 17 wherein the impurity material is one selected from the group consisting of gold, platinum, silver, nickel and copper.

19. The semiconductor device of claim 18 wherein the semiconductor material of the body is silicon, and the impurity material is gold.

20. The semiconductor device of claim 1 wherein one of the mutually adjacent devices in the body includes four regions of alternate and opposite type conductivity, the first and third regions being of the same type conductivity and the second and fourth regions being of the same and opposite type conductivity, the other mutually adjacent device includes two regions of opposite type conductivity, the first region being of the same conductivity type as the second and fourth regions of the one device and the second region being of the same conductivity type as the first and third regions of the one device, the first region of the one device having a surface area coextensive with a surface area of the first region of the other device, the coextensive surfaces comprising the top surface of the body, a first electrical contact affixed to the top surface of the body and in an electrically conductive relationship with the first region of the one device, the first region of the other device and the regions of recrystallized material, the fourth region of one device having a surface area coextensive with a surface area of the second region of the other device, the coextensive surfaces comprising the bottom surface of the body, and a second electrical contact affixed to the bottom surface of the body and in an electrically conductive relationship with the fourth region of the one device, the second region of the other device and the regions of recrystallized semiconductor material.

21. The semiconductor device of claim 20 wherein the preferred planar crystal orientation is (100), the first preferred crystal axis is <100>, and the second preferred crystal axis is one selected from the group consisting of <011> and <0$\bar{1}$1>.

22. The semiconductor device of claim 21 wherein the semiconductor material of the body is one selected from the group consisting of silicon, silicon carbide, germanium and gallium arsenide.

23. The semiconductor device of claim 22 wherein the impurity material is at least one selected from the group consisting of gold, platinum, silver, nickel and copper.

24. The semiconductor device of claim 23 wherein the semiconductor material of the body is silicon, and the impurity material is gold.

25. The semiconductor device of claim 20 wherein the preferred planar crystal orientation is (111), the first preferred crystal axis is <111>, and the second preferred crystal axis is one selected from the group consisting of < 11$\bar{2}$ >, < $\bar{2}$11 >, < 1$\bar{2}$1 >, < 01$\bar{1}$ >, < 10$\bar{1}$ > and < 1$\bar{1}$0 >.

26. The semiconductor device of claim 25 wherein the material of the body is one selected from the group consisting of silicon, silicon carbide, germanium and gallium arsenide.

27. The semiconductor device of claim 26 wherein the impurity material is one selected from the group consisting of gold, platinum, silver, nickel and copper.

28. The semiconductor device of claim 27 wherein the semiconductor material of the body is silicon, and the impurity material is gold.

29. The semiconductor device of claim 20 wherein the preferred planar crystal orientation is (110), the first preferred crystal axis is < 110 >, and the second preferred crystal axis is < 1$\bar{1}$0 >.

30. The semiconductor device of claim 29 wherein the semiconductor material of the body is one selected from the group consisting of silicon, silicon carbide, germanium and gallium arsenide.

31. The semiconductor device of claim 30 wherein the impurity material is at least one selected from the group consisting of gold, platinum, silver, nickel and copper.

32. The semiconductor device of claim 31 wherein the semiconductor material of the body is silicon, and the impurity material is gold.

33. The semiconductor device of claim 1 wherein each of the mutually adjacent devices in the body includes four regions of alternate and opposite type conductivity, the first and third regions of one device and the second and fourth regions of the other device being of the same type conductivity and the second and fourth regions of one device and the first and third regions of the other device being of the same and opposite type conductivity, the first regions of each mutually adjacent device having a surface area coextensive with each other and the top surface of the body, a first electrical contact affixed to the top surface of the body and in an electrically conductive relationship with the first region of the one device, the first region of the other device and the regions of recrystallized semiconductor material, and a second electrical contact affixed to the bottom surface of the body and in an electrically conductive relationship with the fourth region of the one device, the fourth region of the other device and the regions of recrystallized semiconductor material.

34. The semiconductor device of claim 33 wherein the preferred planar crystal orientation is (100), the first preferred crystal axis is < 100 >, and the second preferred crystal axis is one selected from the group consisting of < 011 > and < 0$\bar{1}$1 >.

35. The semiconductor device of claim 34 wherein the semiconductor material of the body is one selected from the group consisting of silicon, germanium, silicon carbide and gallium arsenide.

36. The semiconductor device of claim 35 wherein the solid solubility material is one selected from the group consisting of gold, platinum, silver, nickel and copper.

37. The semiconductor device of claim 36 wherein the semiconductor material of the body is silicon, and the impurity material is gold.

38. The semiconductor device of claim 33 wherein the opposed major surfaces have a preferred planar crystal orientation of (110) and each recrystallized region has a preferred crystal direction of < 1$\bar{1}$0 >.

39. The semiconductor device of claim 38 wherein the semiconductor material of the body is one selected from the group consisting of silicon, germanium, silicond carbide and gallium arsenide.

40. The semiconductor device of claim 39 wherein the solid solubility material is one selected from the group consisting of gold, platinum, silver, nickel and copper.

41. The semiconductor device of claim 40 wherein the semiconductor material of the body is silicon, and the impurity material is gold.

42. The semiconductor device of claim 33 wherein the opposed major surfaces have a preferred planar crystal orientation of (111) and each recrystallized region has a preferred crystal direction selected from the group consisting of $<01\bar{1}>$, $<10\bar{1}>$, $<1\bar{1}0>$, $<11\bar{2}>$, $<\bar{2}11>$ and $<1\bar{2}1>$.

43. The semiconductor device of claim 42 wherein the semiconductor material of the body is one selected from the group consisting of silicon, germanium, silicon carbide and gallium arsenide.

44. The semiconductor device of claim 43 wherein the solid solubility material is one selected from the group consisting of gold, platinum, silver, nickel and copper.

* * * * *